(12) United States Patent
Ju

(10) Patent No.: US 7,959,446 B1  
(45) Date of Patent: Jun. 14, 2011

(54) ELECTRICAL ELEMENT AND ELECTRICAL CONNECTOR

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 12/644,545

(22) Filed: Dec. 22, 2009

(51) Int. Cl.
*H01R 12/00* (2006.01)
*H05K 1/00* (2006.01)

(52) U.S. Cl. .......................................................... 439/71

(58) Field of Classification Search .................... 439/83, 439/65, 66, 70, 71, 63, 82
See application file for complete search history.

(56) References Cited

U.S. PATENT DOCUMENTS 6,814,586 B1 * 11/2004 Ju .................................. 439/66
6,948,946 B1 * 9/2005 Ju .................................. 439/71

* cited by examiner

*Primary Examiner* — Javaid Nasri
(74) *Attorney, Agent, or Firm* — Rosenberg, Klein & Lee

(57) ABSTRACT

An electrical element is revealed. At least one receiving hole disposes on an insulating body. A conductive layer disposes on surfaces of the receiving hole. At least one soldering body mounts in the receiving hole correspondingly and contacts with the conductive layer. Part of the soldering body exposes outside a surface of the insulating body to form a soldering part. The electrical element is further arranged with at least one conductive terminal mounted in the corresponding receiving hole movably and slantingly, the conductive terminal contacts with the conductive layer. Each conductive terminal includes a head part exposed outside the surface of the insulating body for being pressed and contacted. By electrical connection of the conductive layer, the assembly between the soldering body and the terminal is replaced and errors of the assembly between the soldering body and the terminal are eliminated. Therefore, the soldering quality is improved greatly.

12 Claims, 10 Drawing Sheets

ELECTRICAL ELEMENT AND ELECTRICAL CONNECTOR

BACKGROUND OF THE INVENTION

1. Field of the Invention

The present invention relates to an electrical element and an electrical connector, especially to an electrical element and an electrical connector that are electrically connected to a circuit board.

2. Description of Related Art

Nowadays electrical connection points for inputting signals on chips increase along with the increasing of the processing speed and functions of integrated-circuit chips such as central processing unit (CPU). Yet the volume after packaging is getting compact.

In order to catch up with the development of integrated-circuit (IC) chips such as CPU, the electrical connector that connects the IC chips with the circuit board includes more and more terminals with high density. Abundant terminals with high density make how to solder the terminals on the circuit board with good soldering quality become a dilemma. Presently, soldering is the most common way in this field. The electrical connector includes an insulating body, a plurality of terminals received in the insulating body, and a plurality of solder balls corresponding to the terminals. The insulating body is disposed with a plurality of receiving holes and each terminal is received in a corresponding receiving hole. Each terminal electrically connects to the electrical connection points on the IC chips correspondingly. And the electrical connector is soldered to the circuit board by surface mounted technology (SMT).

However, while soldering the solder balls to the circuit board, the solder ball needs to be fixed in the receiving holes in advance. The ways of fixing the solder balls are divided into two groups: one is pre-soldering the solder balls. The solder ball is melted and attached on the terminal in the receiving hole. Then the solder ball is soldered to the circuit board. The other way is that the solder ball is clamped by the terminal. The terminal holds the solder ball and then the solder ball is soldered to the circuit board.

No matter which way the solder ball is fixed, the solder ball is assembled with the terminal firstly and then the soldering is performed. However, all people skilled in this field learn that there are two errors that cause solder ball deformation in the electrical connectors available now. One is generated by the insulating body and the other is caused by assembling. During soldering, the high temperature makes the insulating body warp so that the solder balls in the insulating body are not located on the same plane. Thus dewetting or virtual soldering appears and this leads to the error of the insulating body. Moreover, the abundant terminals with high density is difficult to be the same during manufacturing so that solder balls attached on the terminals are not on the same plane. Due to the above errors, the solder balls have height difference. Thus part of the solder balls are unable to contact with solder paste applied to the circuit board and dewetting or virtual sodering occurs.

Thus there is a need to design an electrical element and an electrical connector that corrects above errors and improve the soldering quality.

SUMMARY OF THE INVENTION

Therefore it is a primary object of the present invention to provide an electrical element as well as an electrical connector that provides optimal soldering quality.

In order to achieve the above object, the present invention provides an electrical element for electrically connecting with an external electrical element and having an insulating body, at least one receiving hole disposed on the insulating body, a conductive layer arranged at a surface of the receiving hole and at least one soldering body mounted in the receiving hole correspondingly and contacting with the conductive layer. Part of the soldering body is exposed outside the surface of the insulating body to form a soldering part that is soldered to the external electrical element.

In order to achieve the above object, the present invention provides an electrical connector for electrically connecting with an external electrical element and having an insulating body, at least one receiving hole disposed on the insulating body, a conductive layer arranged at surface of the receiving hole, at least one conductive terminal mounted in the receiving hole slantingly and moveably, and at least one soldering body mounted in the receiving hole correspondingly and contacting with the conductive layer. Each conductive terminal includes a head part exposed outside the surface of the insulating body for being pressed and contacting. Part of each soldering body is exposed outside the surface of the insulating body to form a soldering part that is soldered to the external electrical element.

In order to achieve above object, the electrical element and the electrical connector of the present invention includes the conductive layer disposed on surface of the receiving hole. The conductive layer contacts with the soldering body so that the assembly between the soldering body and the terminal is replaced by the electrical conduction and connection of the conductive terminal. Compared with techniques available now, the electrical element and the electrical connector of the present invention eliminate assembly errors during manufacturing processes and further improve the soldering quality to a great extent.

BRIEF DESCRIPTION OF THE DRAWINGS

The structure and the technical means adopted by the present invention to achieve the above objects can be best understood by referring to the following detailed description of the preferred embodiments and the accompanying drawings, wherein.

DETAILED DESCRIPTION OF THE PREFERRED EMBODIMENT

Figure 1:
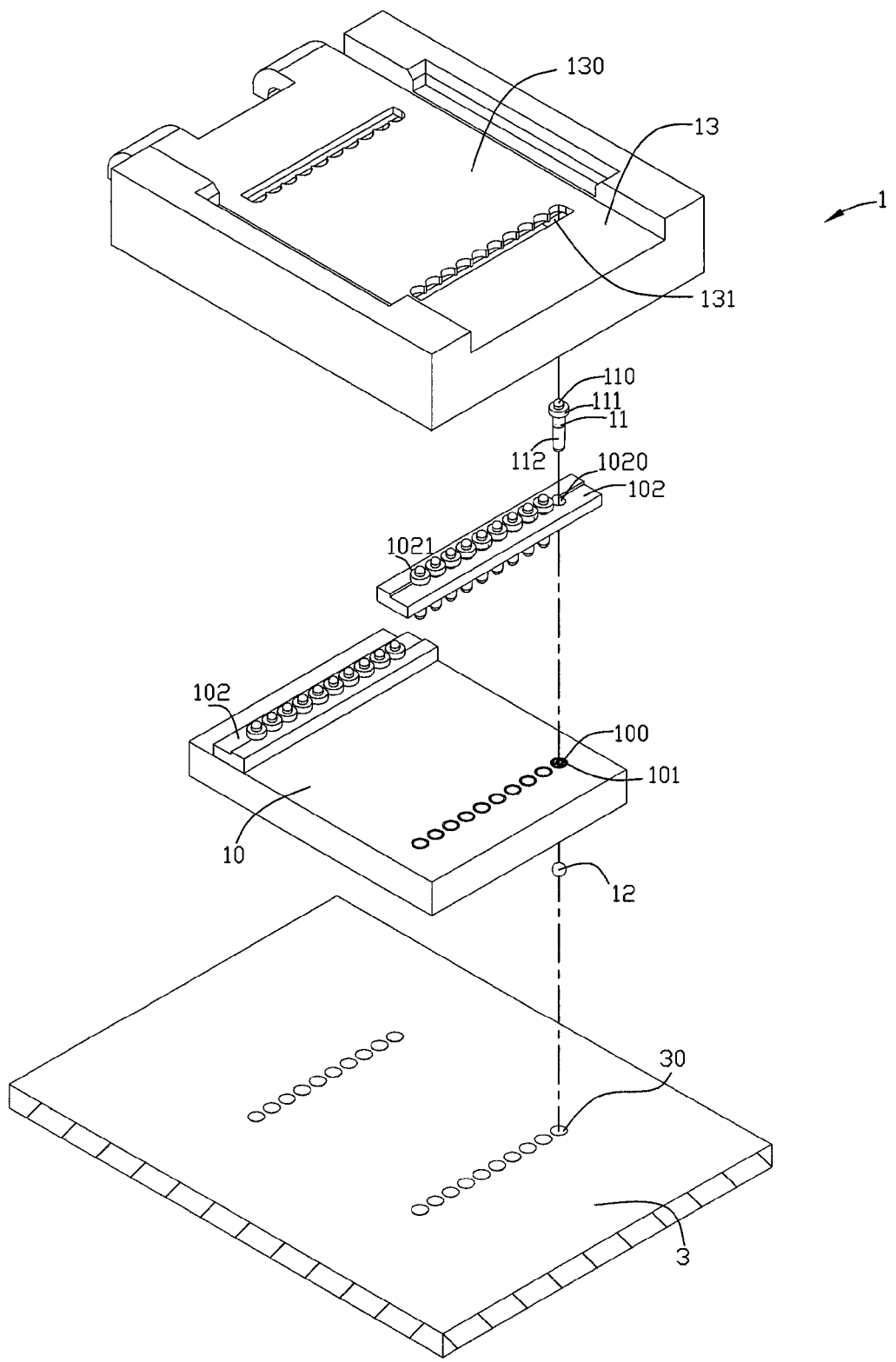
FIG. 1 is an explosive view of the first embodiment of an electrical element and an electrical connector according to the present invention.
Figure 2:
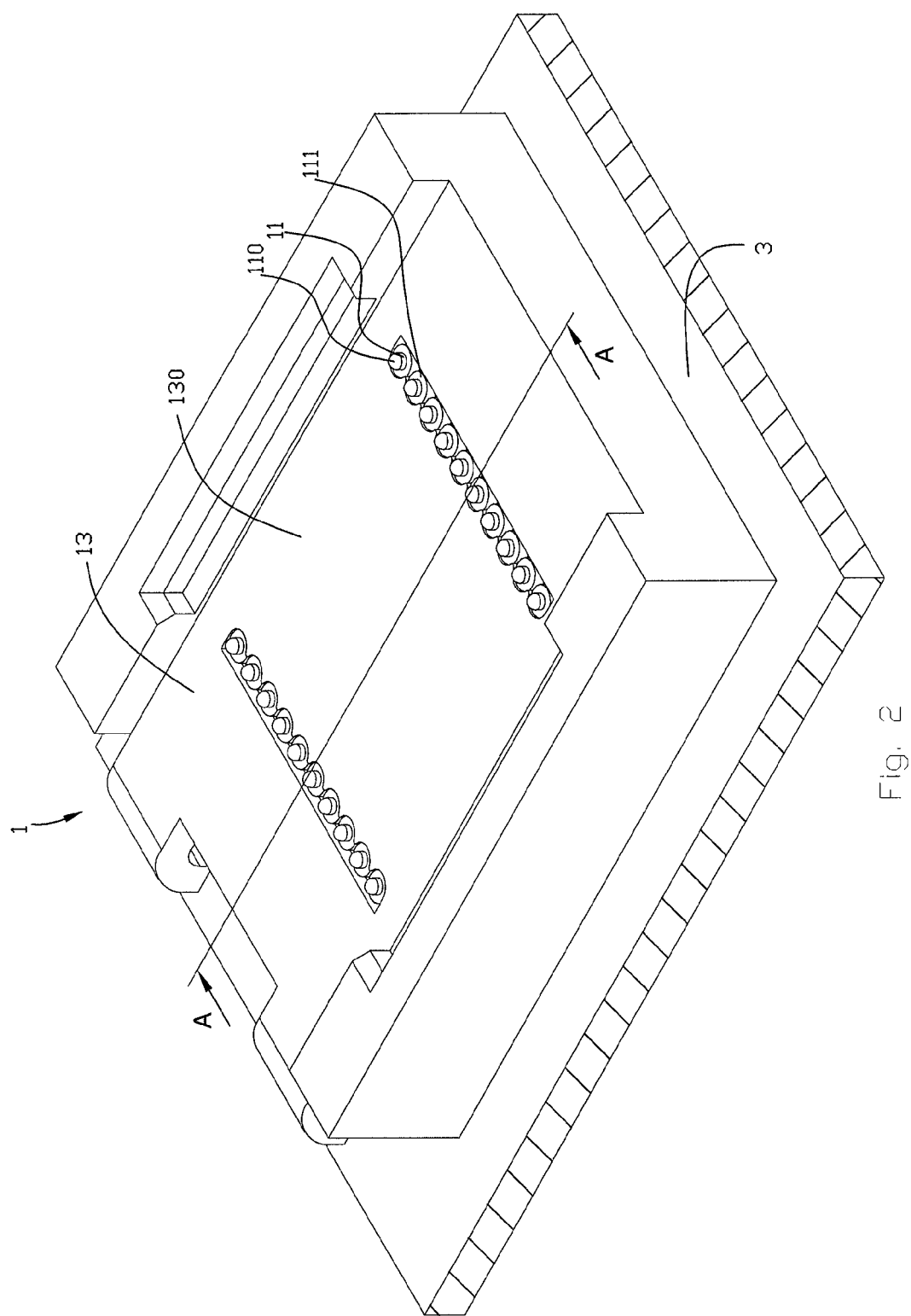
FIG. 2 is an assembled view of the first embodiment of an electrical element and an electrical connector according to the present invention.
Figure 3:
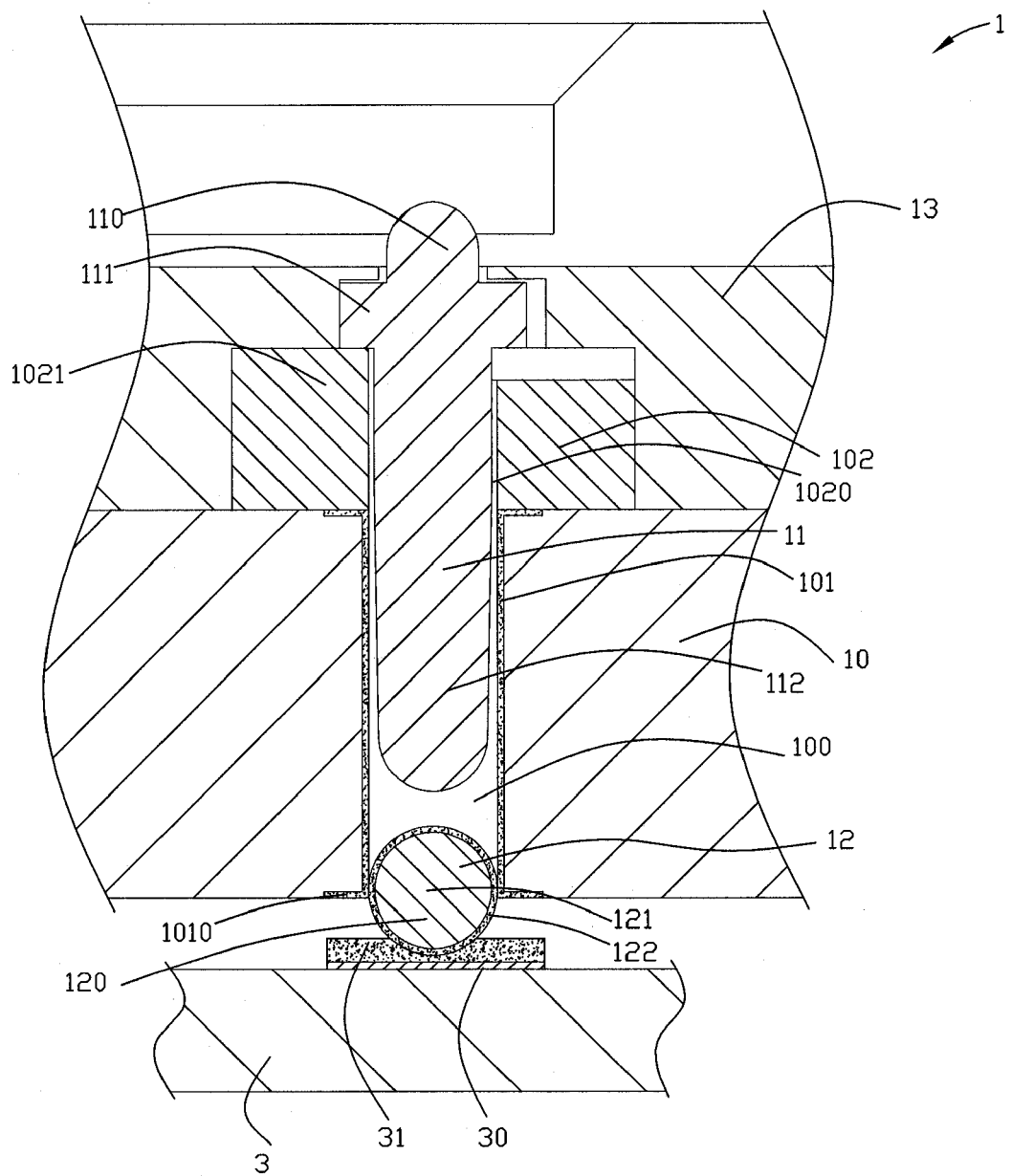
FIG. 3 is a cross sectional view along a line A-A of the embodiment in FIG. 2.
Figure 4:
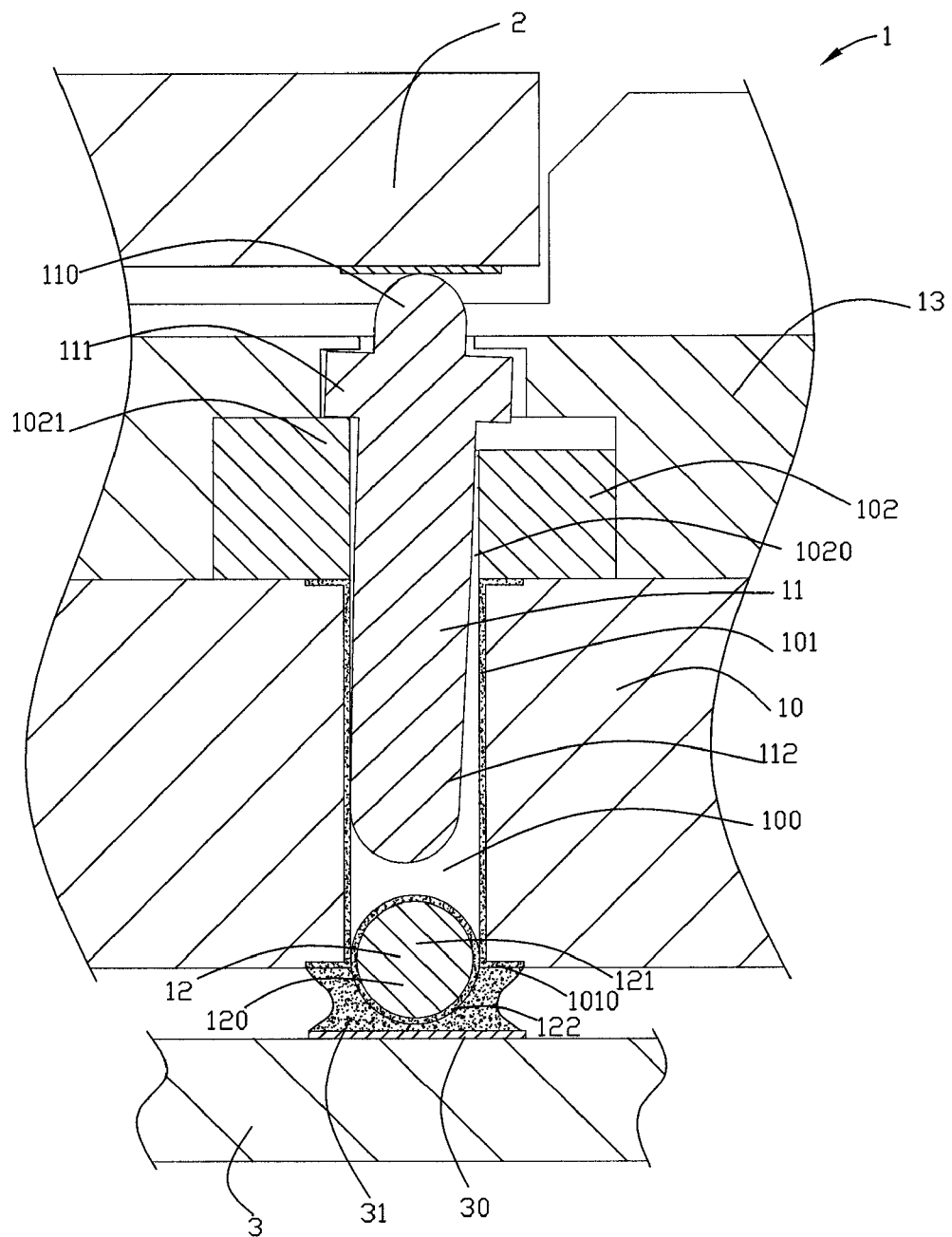
FIG. 4 is a cross sectional view of the embodiment in FIG. 3 with a chip module after soldering.

Refer from FIG. 1 to FIG. 4, the first embodiment of an electrical element and an electrical connector according to the present invention is revealed. In this embodiment, the electrical element is an electrical connector 1 that electrically connects a chip module 2 to a circuit board 3, as shown in FIG. 4. The electrical connector 1 includes an insulating body 10, a cover 13 arranged over the insulating body 10, a plurality of conductive terminals 11 mounted in the insulating body 10, and a plurality of soldering bodies (the soldering bodies are solder balls 12 in this embodiment).

A plurality of receiving holes 100 are disposed on the insulating body 10, penetrating a top surface and a bottom surface thereof. A surface of each of the receiving hole 100 is coated with a conductive layer 101. A solder pad 1010 is arranged at the bottom surface of the insulating body 10, around the receiving hole 100. It will be mentioned later that a soldering part 120 of the solder ball 12 is also on this bottom surface. The conductive layer 101 and the solder pad 1010 are connected with each other and are coated at the same time. Moreover, a strip-shaped elastic body 102 is disposed above the insulating body 10, corresponding to the receiving hole 100. The elastic body 102 is in a step shape with a plurality of through holes 1020 corresponding to the receiving holes 100. A stopper 1021 is set on one side of each of the through holes 1020 so that the side with the stopper 1021 is higher than the other side to form a step.

A loading area 130 is disposed on the cover 13 which is used to receive the chip module 2. A plurality of insertion holes 131 are arranged at the loading area 130, and the loading area 130 corresponds to each receiving hole 100 and each through hole 1020.

The conductive terminal 11 having a head part 110, a press part 111 and a tail part 112 is mounted in the insertion hole 131, the through hole 1020 and the receiving hole 100. The press part 111 extends downward from the head part 110 and the tail part 112 extends downward from the press part 111.

The solder ball 12 is arranged on the bottom of the receiving hole 100, contacting with the conductive layer 101 and part of the solder ball 12 is exposed outside the surface of the insulating body 10 to form the soldering part 120 so as to be soldered to the circuit board 3. During manufacturing process, the flatness of the insulating body 10 is difficult to maintain, with certain warps. In this embodiment, the solder ball 12 is disposed on each receiving hole 100 so that the solder balls 12 are kept on the same plane by some tools even under the condition that the insulating body 10 is prone to warp. This is beneficial to following soldering process. The solder ball 12 consists of a main part which is made of tin 121 and an electroplated layer 122 that covers the tin 121 and has higher melting point. In this embodiment, the electroplated layer 122 is copper.

Refer to FIG. 2, while assembling, each solder ball 12 is arranged under the receiving hole 100 of the insulating body 10 correspondingly and part of the solder ball 12 is exposed outside the receiving hole 100. In this embodiment, the solder ball 12 and the receiving hole 100 are assembled by interference fit. The solder ball 12 is mated with the wall of the receiving hole 100 tightly and there is no gap therebetween.

Then each conductive terminal 11 is inserted into the elastic body 102 from the top to the bottom and the press part 111 is stopped at the stopper 1021 of the elastic body 102 while the tail part 112 enters into the corresponding receiving hole 100. At last, the cover 13 is covered over the insulating body 10. The press part 111 of each conductive terminal 11 is received in the insertion hole 131 of the cover 13 and the head part 110 thereof is exposed outside the insertion hole 131. Thus the assembling of the electrical connector 1 is finished.

Refer to FIG. 3, while soldering the assembled electrical connector 1 to the circuit board 3, each solder ball 12 corresponds to a corresponding solder metal layer 30 of the circuit board 3. The solder metal layer 30 is applied with solder paste 31. Heat the solder ball 12 and the solder paste 31. After heating to a certain temperature, the tin 121 inside the solder ball 12 becomes melted while the electroplated layer 122 covered outside the tin 121 is not melted and broken because the electroplated layer 122 on the outer surface of the solder ball 12 has higher melting point than the tin 121 in the solder ball 12. After melting the solder paste 31 onto the circuit board 3, part of the solder paste 31 attaches on the electroplated layer 122 and some other part adheres to the solder pad 1010 on the bottom surface of the insulating body 10. Thus the climbing of the tin 121 along the conductive terminal 11 caused by a siphon force is reduced and certain anti-siphon effect is achieved. At the same time, soldering area is increased and this favors solder reliability. Furthermore, there is no gap between the electroplated layer 122 and the receiving hole 100. Thus even a little amount of solder paste 31 is not allowed to pass the electroplated layer 122 and move upward. The anti-siphon effect is further enhanced. Moreover, even the electroplated layer 122 is cracked, the part of the electroplated layer 122 located in the receiving hole 100 will not break out. This prevents large amount of tin moving upward and the anti-siphon effect is achieved.

In other embodiments, there may be a gap between the electroplated layer 122 and the receiving hole 100. Under this condition, part of the melted solder paste 31 may pass the gap and move upward but most of the solder paste 31 is adsorbed by the electroplated layer 122 and the solder pad 1010. In addition, large amount of the melted tin 121 in the solder ball 12 is covered and enclosed by the electroplated layer 122. Thus the amount of tin that passes the gap and moves upward is quite little. Therefore, the siphon effect is prevented to a certain extent.

Refer to FIG. 4, after soldering, the chip module 2 is set on the loading area 130 of the cover 13 to contact with the head part 110 of each conductive terminal 11. Press the chip module 2 downwards till against each head part 110 and each press part 111 rests against the stopper 1021 of the elastic body 102. Thus the stopper 1021 contracts and causes the conductive terminal 11 to move downwards. Due to the step caused by height difference between the side of the stopper 1021 and the other side thereof, the stopper 1021 is used as a support point and the press part 111 rotates to the side without the stopper 1021. The tail part 112 of the conductive terminal 11 also rotates to the stopper 1021 and contacts with the conductive layer 101 slantingly so as to form a reliable electrical connection with the conductive layer 101, as shown in FIG. 4. Moreover, the conductive terminal 11 can not only contact with the conductive layer 101 slantingly by the disposition of the stopper 1021 but also by other ways such as being disposed with a rotating shaft. Furthermore, the conductive terminal 11 can be designed to have the same diameter as that of the receiving hole 100. Thus the conductive terminal 11 is inserted into the receiving hole 100 directly, contacting with each other for electrical conduction. In addition, the stopper 1021 is an elastic body so that an elastic contact between the chip module 2 and each conductive terminal 11 is achieved. Even there is a certain height difference between the conductive terminals 11, the reliable contact between the chip module 2 and the conductive terminals 11 is still achieved by the elastic deformation of the stopper 1021.

The soldering body in the electrical element and the electrical connector of the present invention can also be made from other material such as a metal ball. By soldering the metal ball to the circuit board 3, the electrical connection between the electrical element and the electrical connector and the circuit board is provided. The purposes and technical effects similar to those of the above embodiment can also be achieved. Yet compared with the tin 121, the metal has a higher hardness so that the insulating body 10 is getting easier to have bending deformation. Thus, similar to the above embodiment, the metal ball is disposed with tin 121 or other solders with lower hardness therein. Because the tin 121 is softer, it has less effects on the insulating body 10 so that the insulating body 10 is not so easy to have bending deformation. Besides ball-shaped, the soldering body can be other shapes such as columnar.

Figure 5:
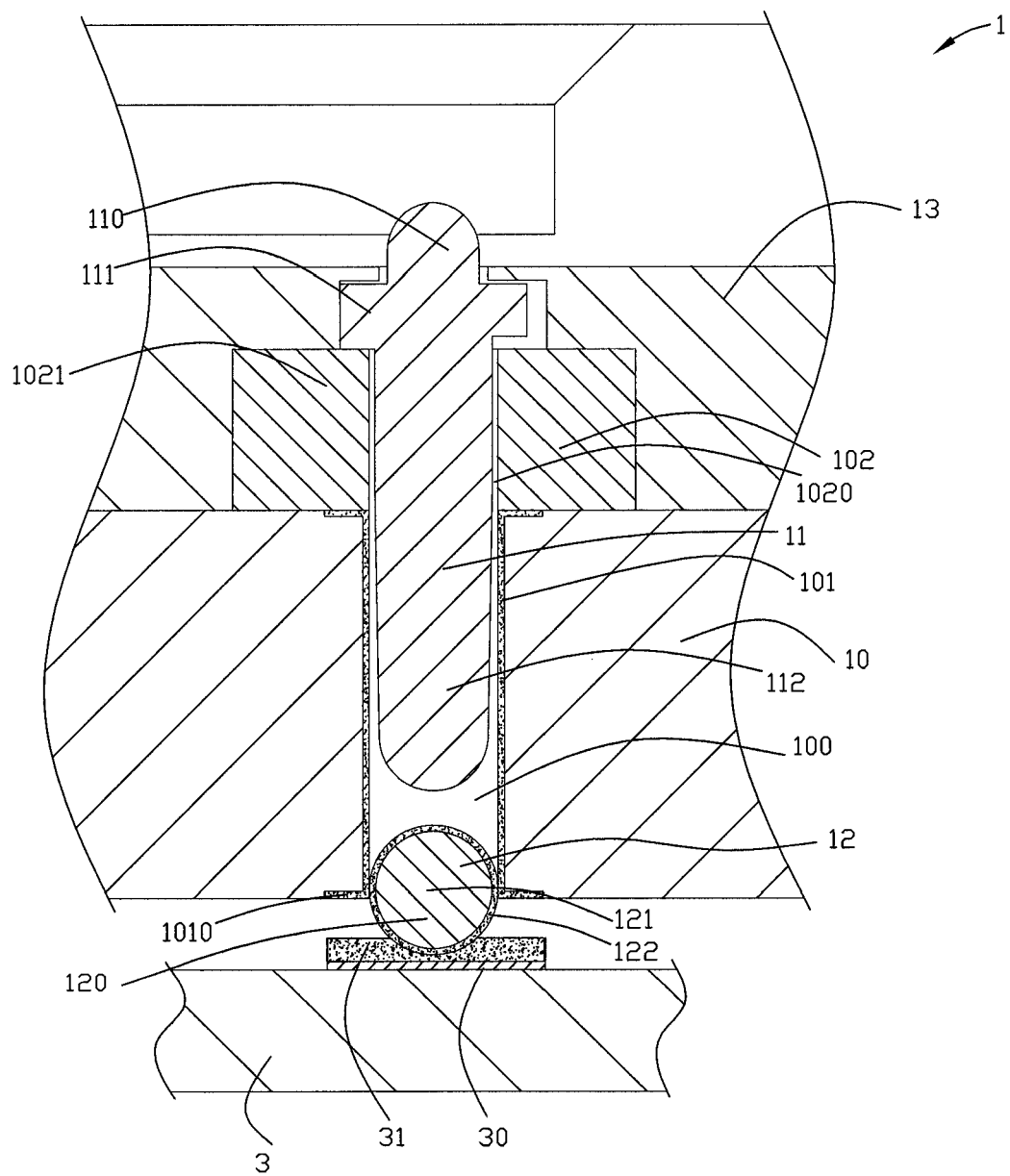
FIG. 5 is a cross sectional view of the second embodiment before soldering of an electrical element and an electrical connector according to the present invention.
Figure 6:
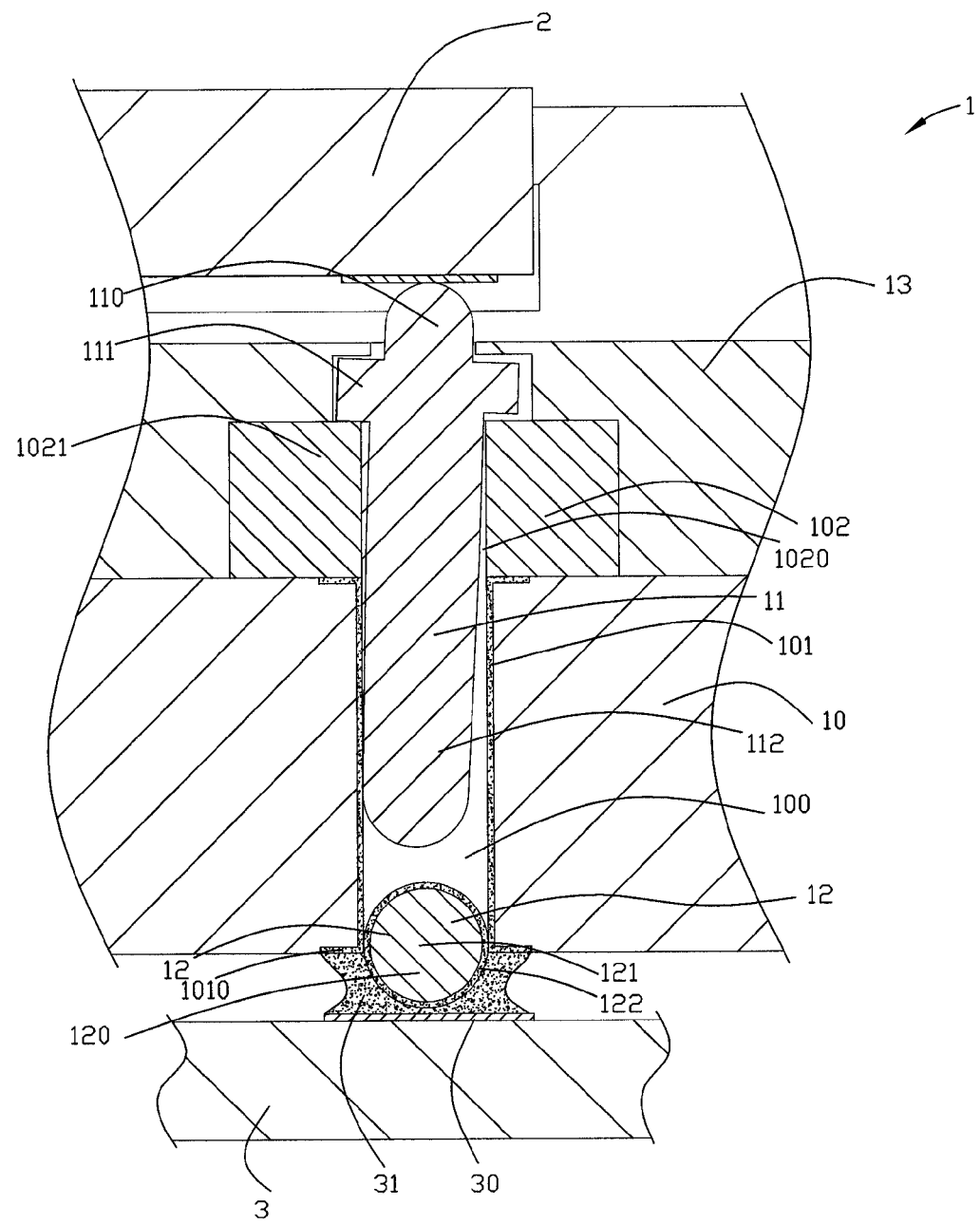
FIG. 6 is a cross sectional view of the second embodiment in FIG. 5 with a chip module after soldering.

Refer to FIG. 5 and FIG. 6, the second embodiment of the electrical element and the electrical connector of the present invention is revealed. The difference between this embodiment is in that: the elastic body 102 has a flat top surface and there is a height difference between bottom surfaces on two sides of the press part 111. The left side bottom surface is lower than the right side bottom surface. After the electrical connector 1 being assembled and soldered, the chip module 2 is set above the cover 13 and is pressed downward. Then the conductive terminal 11 moves downward, the left side of the elastic body 102 serves as a support point (the elastic body 102 used as a stopper) and the press part 111 rotates to the right side of the elastic body 102 while the tail part 112 of the conductive terminal 11 rotates to the left side (the bottom surface of the press part 111 with lower height) and contacts with the conductive layer 101 slantingly so as to electrically connect with the conductive layer 101 precisely and reliably. In other embodiments, the bottom surfaces on two sides of the press part 111 can be irregular surfaces as long as the two bottom surfaces have height difference. This embodiment achieves similar functions and effects as the above embodiment.

Figure 7:
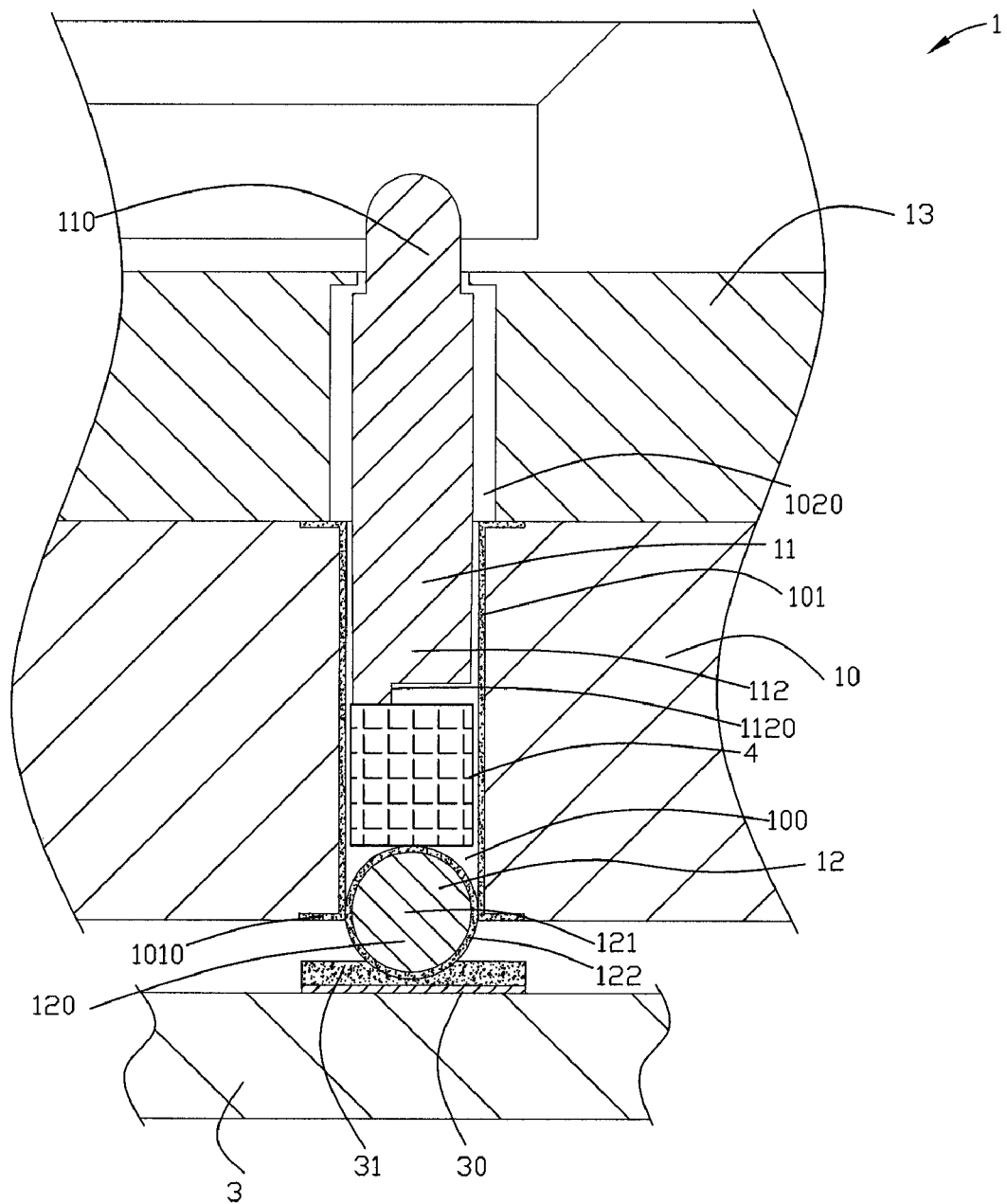
FIG. 7 is a cross sectional view of the third embodiment before soldering of an electrical element and an electrical connector according to the present invention.
Figure 8:
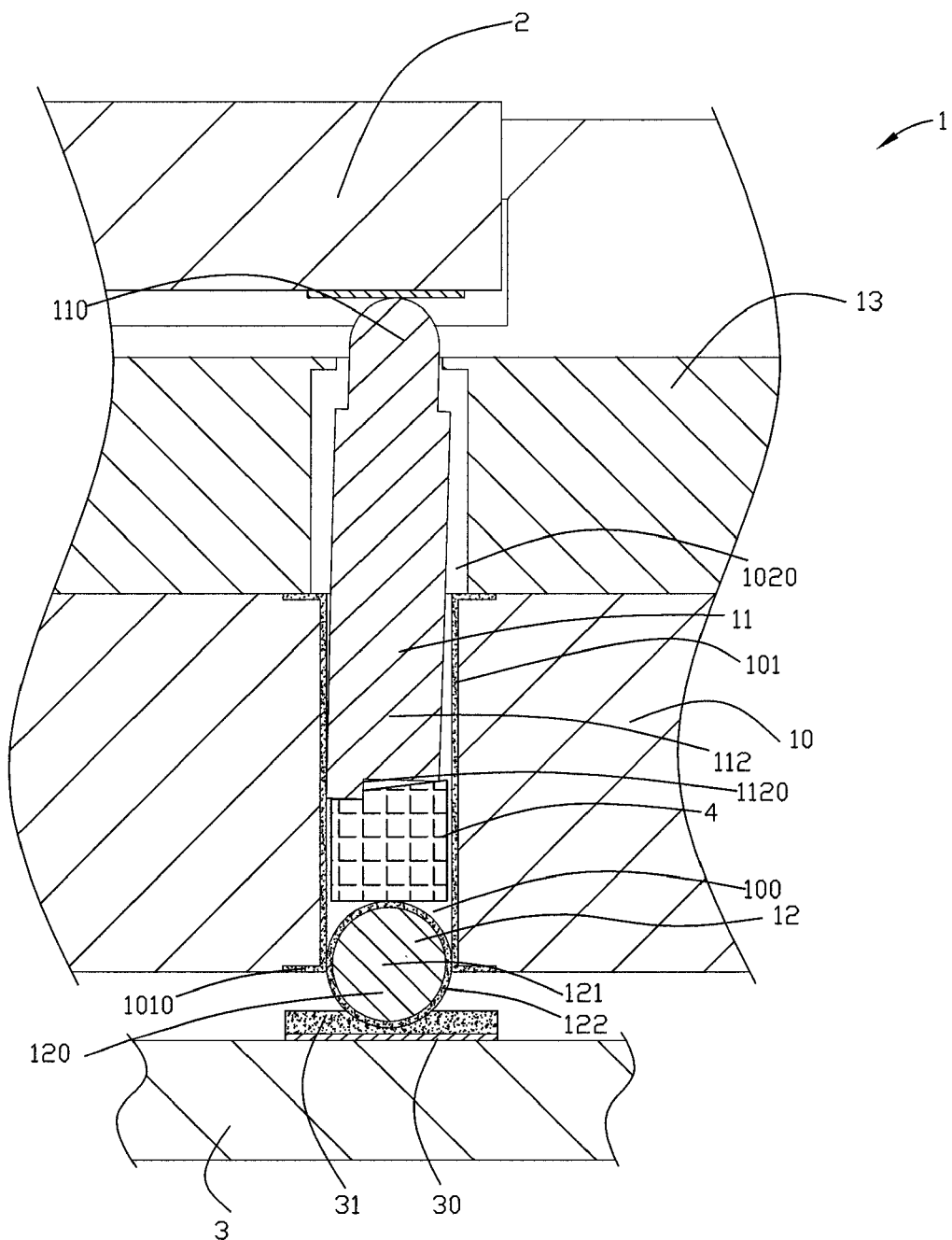
FIG. 8 is a cross sectional view of the third embodiment in FIG. 7 with a chip module after soldering.

Refer to FIG. 7 and FIG. 8, the third embodiment is disclosed. The difference between this embodiment and the first embodiment is in that: the insulating body 10 is not disposed with the elastic body 102. In the receiving hole 100, the soldering body is disposed with an elastic rubber block 4 (or other elastic material) stopping against the conductive terminal 11. By the rubber block 4, the conductive terminal 11 is elastically contacted with the chip module 2. Moreover, the one side of the conductive terminal 11 that contacts with the rubber block 4 is a step-like surface 1120. After the electrical connector 1 being assembled and soldered, the chip module 2 is put above the cover 13 and is pressed downward. Then the conductive terminal 11 moves downward and presses the rubber block 4. Due to the step-like surface of the conductive terminal 11 that contacts with the rubber block 4, the conductive terminal 11 slants to one side and contacts with the conductive layer 101 reliably under the reaction force from the rubber block 4. In other embodiments, the side of the conductive terminal 11 that contacts with the rubber block 4 can be a slope or other surfaces with certain angles as long as it can make the conductive terminal 11 slant to one side while pressing the rubber block 4.

Figure 9:
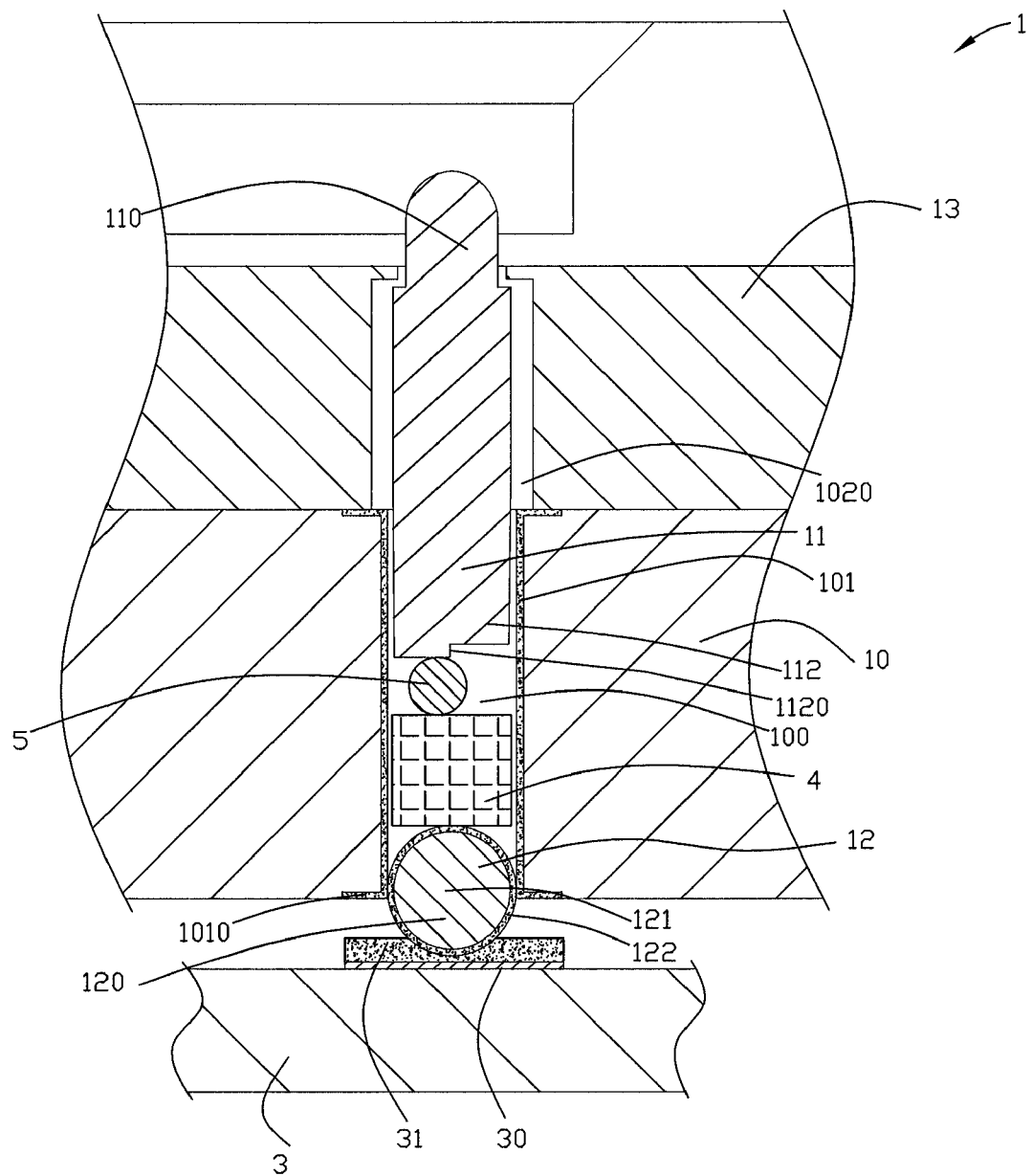
FIG. 9 is a cross sectional view of the fourth embodiment before soldering of an electrical element and an electrical connector according to the present invention.
Figure 10:
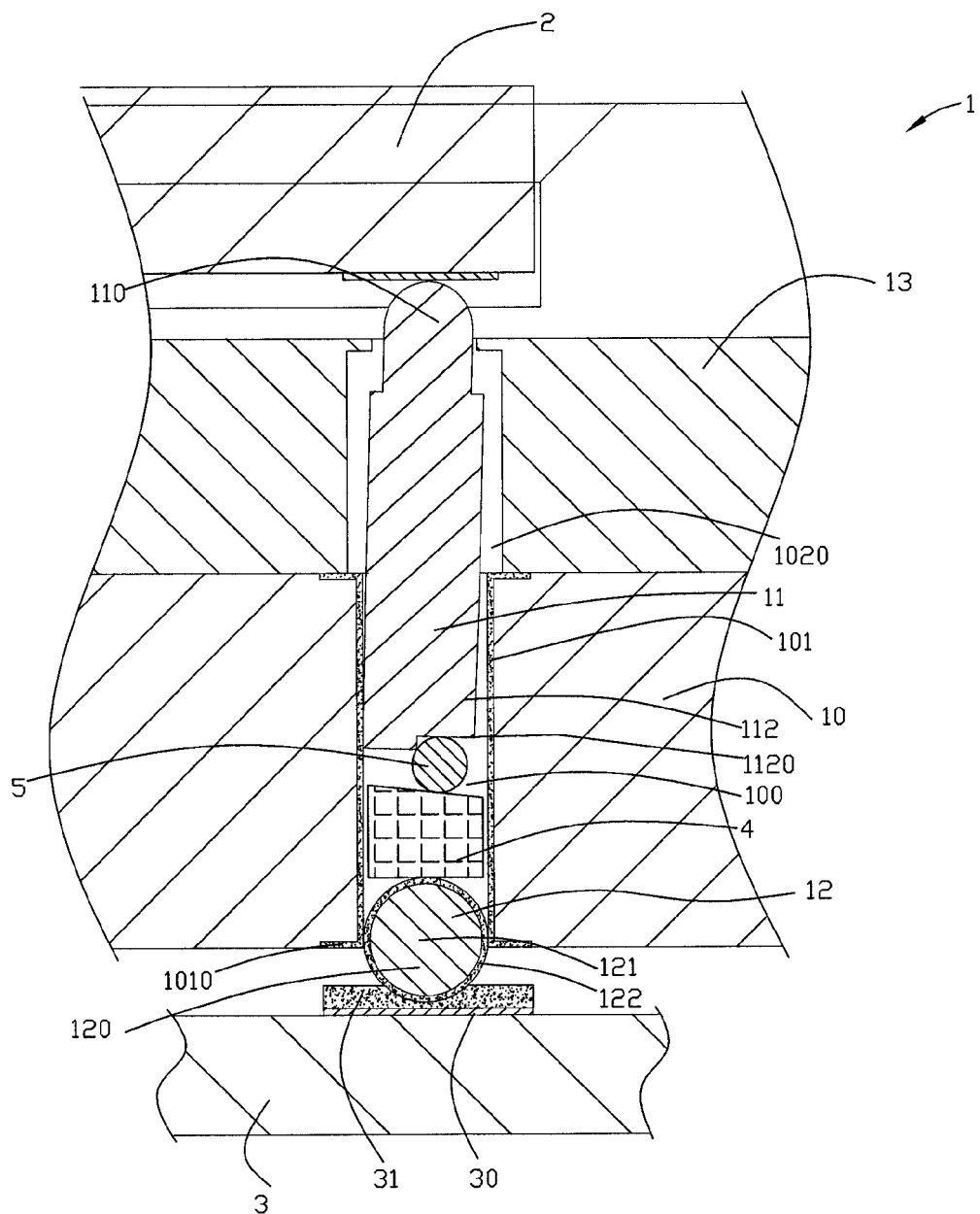
FIG. 10 is a cross sectional view of the fourth embodiment in FIG. 9 with a chip module after soldering.

As shown in FIG. 9 and FIG. 10, the fourth embodiment is revealed. The difference between this embodiment and the above one is in that: a ball 5 is disposed between the rubber block 4 and the conductive terminal 11. Thereby when the conductive terminal 11 is pressed and contacted by the chip module 2, the conductive terminal 11 can slantingly contact with the conductive layer 101 more easily and reliably.

Moreover, the way of conducting by the connection between the soldering body and the conductive layer 101 and disposition of the conductive layer 101 as well as the soldering body in the receiving hole 100 in the present invention for replacement of the assembly of the terminal with the solder ball in techniques available now can also be applied to other electrical elements such as chips or circuit boards.

In summary, the electrical element and the electrical connector according to the present invention have following advantages:

1. The electrical element and the electrical connector of the present invention achieve the electrical conduction between the soldering body and the conductive layer by the conductive layer as well as the soldering body mounted in the receiving hole. There is no need to consider the assembling between the soldering body and the conductive terminal. Thus the errors occurred during manufacturing processes mentioned above are eliminated. That means even there is a height difference among abundant conductive terminals, the flatness of respective soldering body is not affected. The soldering body is not influenced. Thus optimal soldering quality is attained.

2. The electrical element and the electrical connector of the present invention are arranged at the bottom surface of the insulating body and the solder pad connecting and conducting with the conductive layer is disposed around the receiving hole. Thus while soldering, part of the melted solder paste is adsorbed on the solder pad so as to prevent the siphon effect to a certain degree.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electrical connector for electrical connection with an external electrical element, comprising:
    an insulating body disposed with at least one receiving hole, a conductive layer arranged at a surface of the receiving hole;
    at least one conductive terminal that is mounted in the corresponding receiving hole movably, slantingly and contacting with the conductive layer while being slanted and each of the conductive terminal having a head part exposed outside the insulating body for being pressed and contacted;
    at least one soldering body mounted in the corresponding receiving hole, contacting with the conductive layer and part thereof exposed outside a surface of the insulating body so as to form a soldering part for being soldered to the external electrical element; and
    an elastic body pressing against the conductive terminal and the soldering body, one side of the conductive terminal that contacts with the elastic body being sloped.

2. The electrical connector as claimed in claim 1, wherein the soldering body is assembled with a wall of the receiving hole tightly.

3. The electrical connector as claimed in claim 1, wherein the soldering body is a solder ball coated with an electroplated layer on a surface thereof while the melting point of the electroplated layer is higher than the melting point of tin inside the solder ball.

4. The electrical connector as claimed in claim 1, wherein the soldering body is a metal ball.

5. The electrical connector as claimed in claim 1, wherein the insulating body includes a solder pad for adsorbing solder, the solder pad is disposed on a surface of the soldering part, around the receiving hole and the solder pad is connected with the conductive layer.

6. The electrical connector as claimed in claim 1, wherein a ball is further arranged between the elastic body and the conductive terminal.

7. An electrical connector for electrical connection with an external electrical element, comprising:
   an insulating body disposed with at least one receiving hole, a conductive layer arranged at a surface of the receiving hole;
   at least one conductive terminal that is mounted in the corresponding receiving hole movably, slantingly and contacting with the conductive layer while being slanted and each of the conductive terminal having a head part exposed outside the insulating body for being pressed and contacted;
      at least one soldering body mounted in the corresponding receiving hole, contacting with the conductive layer and part thereof exposed outside a surface of the insulating body so as to form a soldering part for being soldered to the external electrical element; and
      a stopper set on an outside of the receiving hole of the insulating body and a side with the stopper being higher than a side thereof without the stopper; the conductive terminal includes a press part extending from one end of the head part, and a tail part extending from the press part; when the head part is pressed, the press part presses against the stopper outside the receiving hole and the tail part rotates to the stopper and contacts with the conductive layer.

8. The electrical connector as claimed in claim 7, wherein the stopper is an elastic body.

9. An electrical connector for electrical connection with an external electrical element, comprising:
   an insulating body disposed with at least one receiving hole, a conductive layer arranged at a surface of the receiving hole;
   at least one conductive terminal that is mounted in the corresponding receiving hole movably, slantingly and contacting with the conductive layer while being slanted and each of the conductive terminal having a head part exposed outside the insulating body for being pressed and contacted;
      at least one soldering body mounted in the corresponding receiving hole, contacting with the conductive layer and part thereof exposed outside a surface of the insulating body so as to form a soldering part for being soldered to the external electrical element; and
      a stopper disposed adjacent to the receiving hole of the insulating body, wherein the conductive terminal includes a press part extending downwardly from one end of the head part and a tail part extending downwardly from the press part; there is a height difference between bottom surfaces on two sides of the press part, so when the head part is pressed, the press part presses against the stopper and the tail part rotates to the lower bottom surface of the press part and contacts with the conductive layer.

10. The electrical connector as claimed in claim 9, wherein the stopper is an elastic body.

11. An electrical connector for electrical connection with an external electrical element, comprising:
   an insulating body disposed with at least one receiving hole, a conductive layer arranged at a surface of the receiving hole;
   at least one conductive terminal that is mounted in the corresponding receiving hole movably, slantingly and contacting with the conductive layer while being slanted and each of the conductive terminal having a head part exposed outside the insulating body for being pressed and contacted;
   at least one soldering body mounted in the corresponding receiving hole, contacting with the conductive layer and part thereof exposed outside a surface of the insulating body so as to form a soldering part for being soldered to the external electrical element; and
      an elastic body pressing against the conductive terminal and the soldering body, one side of the conductive terminal that contacts with the elastic body having a step-like surface.

12. The electrical connector as claimed in claim 11, wherein a ball is further arranged between the elastic body and the conductive terminal.

* * * * *